United States Patent

Hashimoto

(10) Patent No.: US 9,326,378 B2
(45) Date of Patent: Apr. 26, 2016

(54) THIN-FILM WIRING SUBSTRATE AND SUBSTRATE FOR PROBE CARD

(75) Inventor: Toshihiro Hashimoto, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 14/342,300

(22) PCT Filed: Aug. 29, 2012

(86) PCT No.: PCT/JP2012/071816
§ 371 (c)(1),
(2), (4) Date: Feb. 28, 2014

(87) PCT Pub. No.: WO2013/031822
PCT Pub. Date: Mar. 7, 2013

(65) Prior Publication Data
US 2014/0224532 A1 Aug. 14, 2014

(30) Foreign Application Priority Data

Aug. 29, 2011 (JP) .................................. 2011-186178

(51) Int. Cl.
*H05K 1/00* (2006.01)
*H05K 1/03* (2006.01)
(Continued)

(52) U.S. Cl.
CPC .......... *H05K 1/0306* (2013.01); *G01R 1/07314* (2013.01); *G01R 31/2886* (2013.01); *H05K 1/0271* (2013.01); *H05K 3/4605* (2013.01);
(Continued)

(58) Field of Classification Search
CPC . H05K 1/0306; H05K 1/0291; H05K 3/4605; H05K 2203/061; H05K 3/4069; H05K 3/386; H05K 1/0271; H05K 3/467; G01R 31/2886; G01R 1/07314
See application file for complete search history.

(56) References Cited

U.S. PATENT DOCUMENTS 6,197,407 B1 * 3/2001 Andou et al. ................. 428/209
6,399,892 B1 * 6/2002 Milkovich et al. ............ 174/258
(Continued)

FOREIGN PATENT DOCUMENTS

| JP | 2003218531 A | 7/2003 |
| JP | 2006-173333 A | 6/2006 |

(Continued)

OTHER PUBLICATIONS

Epoxy data sheet, glass epoxy data sheet, polyamide-imide datasheet, MakeItFrom.com, 2009-2015.*
(Continued)

*Primary Examiner* — Steven T Sawyer
(74) *Attorney, Agent, or Firm* — Volpe and Koenig, P.C.

(57) ABSTRACT

A thin-film wiring substrate includes a base B including a ceramic substrate having an upper surface and a wiring conductor provided on the upper surface of the ceramic substrate; a bonding layer and a thin-film wiring layer laminated in order on the upper surface of the ceramic substrate; and a through conductor that passes through the bonding layer in a thickness direction and electrically connects the wiring conductor to the thin-film wiring layer, Wherein the bonding layer includes a core layer composed of a thermosetting resin and adhesive layers respectively laminated on an upper surface and a lower surface of the core layer, the adhesive layers being composed of a thermosetting resin having an elastic modulus smaller than that of the thermosetting resin constituting the core layer.

4 Claims, 5 Drawing Sheets

(51) Int. Cl.
*G01R 31/28* (2006.01)
*H05K 3/46* (2006.01)
*G01R 1/073* (2006.01)
*H05K 1/02* (2006.01)

(52) U.S. Cl.
CPC .............. *H05K 3/467* (2013.01); *H05K 3/4673* (2013.01); *H05K 2203/061* (2013.01)

(56) References Cited

U.S. PATENT DOCUMENTS

| | | | |
|---|---|---|---|
| 2004/0067348 A1 | 4/2004 | Nishii | |
| 2004/0231151 A1* | 11/2004 | Nakatani | H05K 1/113 29/830 |
| 2008/0180118 A1* | 7/2008 | Itou et al. | 324/754 |
| 2009/0229862 A1 | 9/2009 | Nakamura et al. | |

FOREIGN PATENT DOCUMENTS

| | | |
|---|---|---|
| JP | 2006156432 A | 6/2006 |
| JP | 2006275714 A | 10/2006 |
| JP | 2007173429 A | 7/2007 |
| JP | 2011009694 A | 1/2011 |
| JP | 2011009698 A | 1/2011 |
| WO | 03009660 A1 | 1/2003 |
| WO | 2007052799 A1 | 5/2007 |

OTHER PUBLICATIONS

International Search Report, PCT/JP2012/071816, Oct. 2, 2012, 2pp.

* cited by examiner

THIN-FILM WIRING SUBSTRATE AND SUBSTRATE FOR PROBE CARD

FIELD OF INVENTION

The present invention relates to a thin-film wiring substrate including a thin-film wiring layer laminated on an upper surface of a ceramic substrate, and relates to a substrate for a probe card including a thin-film wiring substrate.

BACKGROUND

Thin-film wiring substrates each including a thin-film wiring layer laminated on an upper surface of a ceramic substrate have been known as wiring substrates (space transformer substrates) for electrically connecting connection pads provided on a lower surface to external electric circuits, the connection pads being electrically connected to terminals on an upper surface to which semiconductor elements are connected. The thin-film wiring substrates are used as, for example, substrates for so-called probe cards adapted for electrically testing semiconductor elements. In testing semiconductor elements, the thin-film wiring substrates are pressed on the semiconductor elements with predetermined pressure.

The ceramic substrates each include a wiring conductor which is formed on the upper surface of an insulating base composed of an aluminum oxide sintered body or the like, and a connection pad for external connection which is formed on an outer surface such as a lower surface, the wiring conductor being electrically connected to the connection pad. The thin-film wiring layer is formed by, for example, depositing a thin-film conductor composed of a copper plating layer or the like on a surface of a resin insulating layer. In the thin-film conductor, a portion exposed in the uppermost surface of the thin-film wiring layer functions as a terminal to be connected to an electrode of a semiconductor element.

In recent years, a thin-film wiring substrate has been proposed in which a thin-film wiring layer and a ceramic substrate, which are separately formed, are bonded through a bonding layer composed of an adhesive resin material. This is based on consideration of productivity and practicability (so-called coping with wide-variety production) of thin-film wiring substrates. The bonding layer has a through conductor (via conductor) formed for electrically connecting a wiring conductor of the ceramic substrate to a thin-film conductor of the thin-film wiring layer.

CITATION LIST

Patent Literature

PTL 1: Japanese Unexamined Patent Application Publication No. 2003-218531
PTL 2: Japanese Unexamined Patent Application Publication No. 2006-173333

SUMMARY

Technical Problem

However, the above-described thin-film wiring substrate of the related art has the problem that the resin material forming the bonding layer is possibly deformed, that is, possibly stretched in the transverse direction, by pressure applied during bonding of thin-film wiring layer or testing of a semiconductor element. In this case, for example, when the thin-film wiring layer is bonded to the ceramic substrate, the deformed resin material enters between the end surface of the via conductor of the bonding layer and a conductor portion of the thin-film wiring layer or a wiring conductor, thereby possibly causing the problem of hindering electrical connection between the conductor portion of the thin-film wiring layer or the wiring conductor and the via conductor, or the like.

The present invention has been achieved in consideration of the above-described problem of the related art and an object of the present invention is to provide a thin-film wiring substrate including a ceramic substrate and a bonding layer and a thin-film wiring layer which are laminated in order on the ceramic substrate, that is, a thin-film wiring substrate including a thin-film wiring layer bonded to the upper surface of a ceramic substrate through a bonding layer, wherein electrical connection between a wiring conductor of the ceramic substrate and the thin-film wiring layer can be satisfactorily secured.

Solution to Problem

According to an embodiment of the present invention, a thin-film wiring substrate includes a base including a ceramic substrate having an upper surface and a wiring conductor provided on the upper surface of the ceramic substrate, a bonding layer and a thin-film wiring layer laminated in order on the upper surface of the ceramic substrate, and a through conductor that passes through the bonding layer in a thickness direction and electrically connects the wiring conductor to the thin-film wiring layer. The bonding layer includes a core layer composed of a thermosetting resin and an adhesive layer laminated on each of the upper and lower surfaces of the core layer and composed of a thermosetting resin having smaller elastic modulus than the thermosetting resin constituting the core layer.

Advantageous Effects of Invention

In a thin-film wiring substrate according to an embodiment of the present invention, a bonding layer contains a core layer composed of a thermosetting resin having larger elastic modulus than adhesive layers which are directly bonded to a ceramic substrate and a thin-film wiring layer, and thus deformation of the bonding layer can be effectively suppressed.

That is, even when pressure is applied during bonding of the thin-film wiring layer to the ceramic substrate or during testing of a semiconductor element, the core layer having relatively high elastic modulus is little deformed, thereby effectively suppressing deformation of the adhesive layers laminated on the upper and lower surfaces of the core layer. Therefore, the problem that the resin material (thermosetting resin material) constituting the bonding layer enters between the end surface of a via conductor of the bonding layer and a conductor of the thin-film wiring layer is effectively suppressed. Therefore, it is possible to provide a thin-film wiring substrate including a bonding layer and a thin-film wiring layer laminated in order on the upper surface of a ceramic substrate, wherein electrical connection between a wiring conductor of the ceramic substrate and the thin-film wiring layer can be satisfactorily secured. Also, adhesion of the bonding layer to the ceramic substrate and the thin-film wiring layer can be secured by the adhesive layers.

DETAILED DESCRIPTION OF THE PREFERRED EMBODIMENTS

Figure 1:
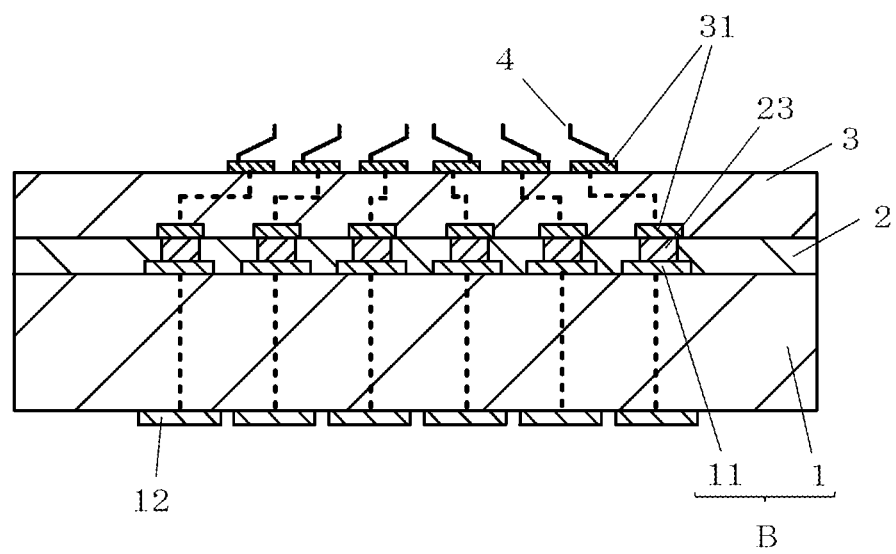
FIG. 1 is a sectional view showing an example of a thin-film wiring substrate according to an embodiment of the present invention.
Figure 2:
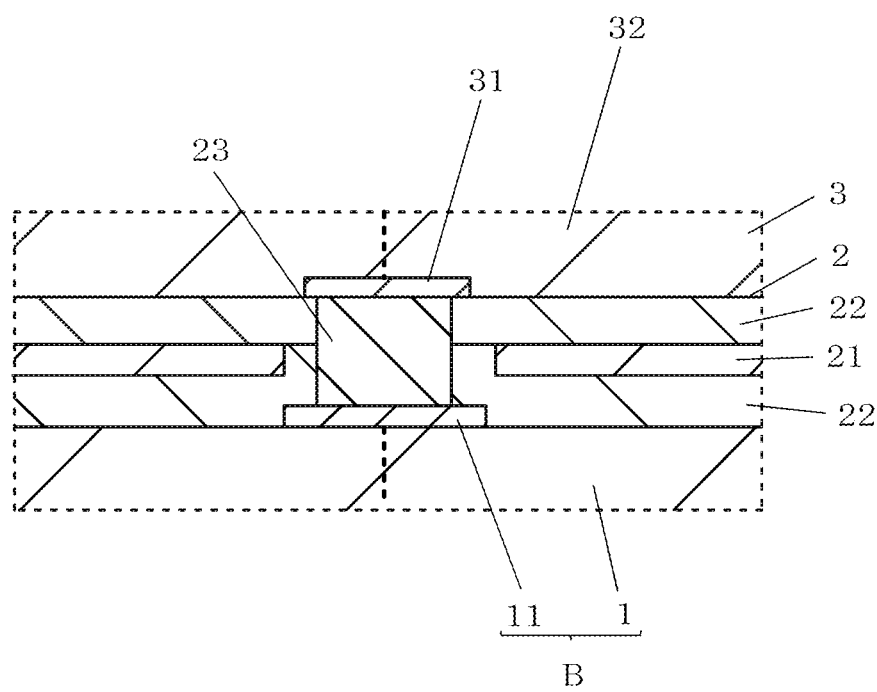
FIG. 2 is an enlarged sectional view of a principal portion, showing an enlarged principal portion of the thin-film wiring substrate shown in FIG. 1.

A thin-film wiring substrate of the present invention is described in detail with reference to the attached drawings. FIG. 1 is a sectional view showing an example of a thin-film wiring substrate according to an embodiment of the present invention, and FIG. 2 is an enlarged sectional view of a principal portion, showing an enlarged principal portion of the thin-film wiring substrate shown in FIG. 1. A thin-film wiring substrate is basically formed by laminating in order a bonding layer 2 and a thin-film wiring layer 3 on the upper surface of a ceramic substrate 1 contained in a base B.

The base B includes the ceramic substrate 1 having a rectangular parallelepiped having an upper surface or the like, and a wiring conductor 11 provided on the upper surface of the ceramic substrate 11.

The ceramic substrate 1 has the function of securing rigidity of the entire thin-film wiring substrate. By forming the thin-film wiring layer 3 on the ceramic substrate 1, a thin-film wiring substrate which can be used for a probe card or the like and which includes fine wiring formed on a high-rigidity substrate and being capable of responding to an electrode of a semiconductor element can be formed. When the thin-film wiring substrate is used as a probe card, the substrate is pressed on a semiconductor element with predetermined pressure in order to secure electric connection to the semiconductor element.

The ceramic substrate 1 is made of a ceramic material such as a ceramic material (so-called machinable ceramic) capable of precision machining substantially equivalent to metallic materials, the ceramic material being composed of, for example, an aluminum oxide sintered body, an aluminum nitride sintered body, a mullite sintered body, a glass ceramic sintered body, or a microcrystal sintered body of crystallized glass formed by precipitating a crystal component in a glass base material, mica, aluminum titanate, or the like.

For example, when the ceramic substrate 1 is composed of an aluminum oxide sintered body, the ceramic substrate 1 can be formed as follows. That is, an appropriate organic binder and organic solvent are added to and mixed with raw material powders such as aluminum oxide, silicon oxide, and the like to prepare a slurry, the slurry is formed into a sheet by a sheet forming technique such as a doctor blade method, a lip coater method, or the like to form a ceramic green sheet, the ceramic green sheet is cut or punched to form a ceramic green sheet having proper shape and dimensions, and then the ceramic green sheet is fired at a temperature of about 1300° C. to 1500° C.

The wiring conductor 11 is formed on the upper surface of the ceramic substrate 1. The wiring conductor 11 is electrically connected to the thin-film wiring layer 3 through a via conductor 23 of the bonding layer 2 described below. Also, the wiring conductor 11 is electrically connected to a connection pad 12 formed on the lower surface of the ceramic substrate 1 through an internal conductor such as a through conductor or the like formed in the ceramic substrate 1. In FIGS. 1 and 2, the internal conductor is schematically shown by a broken line (with no reference numeral).

The wiring conductor 11, the internal conductor, and the connection pad 12 are made of a metallic material such as tungsten, molybdenum, manganese, copper, silver, palladium, gold, platinum, or the like. These metallic materials may be used as an alloy in combination of two or more. The metallic material is deposited at a predetermined position of the ceramic substrate 1 by a method such as a metallization method, a plating method, or the like.

When the wiring conductor 11, the internal conductor, and the connection pad 12 are composed of, for example, tungsten, tungsten can be deposited by applying tungsten paste to a surface of a ceramic green sheet used as the ceramic substrate 1 and applying or filling in a through hole formed in advance in the ceramic green sheet, and then firing the paste at the same time as the ceramic green sheet.

The bonding layer 2 is adapted for bonding the thin-film wiring layer 3 on the ceramic substrate 1. The bonding layer 2 has the through conductor (so-called via conductor) 23 formed to pass through in the thickness direction. The thin-film wiring substrate including the thin-film wiring layer 3 bonded to the ceramic substrate 1 through the bonding layer 2 is excellent in productivity and practicability (so-called coping with wide-variety production). That is, in this case, the thin-film wiring substrate can be manufactured by bonding the ceramic substrate 1 and the thin-film wiring layer 3, which are separately formed, through the bonding layer 2. Therefore, manufacturing is easy as compared with a case where the thin-film wiring layer 3 is laminated directly on the upper surface of the ceramic substrate 1. Also, various thin-film wiring layers 3 can be prepared at the same time, thereby easily coping with wide-variety production. The bonding layer 2 is described in detail later.

The thin-film wiring layer 3 includes a thin-film conductor layer 31 which is formed by deposition on a surface of a resin insulating layer 32 and which is composed of, for example, a metallic material such as copper, silver, palladium, gold, platinum, aluminum, chromium, nickel, cobalt, titanium, or the like, or an alloy material of these metallic materials.

The thin-film conductor layer 31 can be formed in a predetermined pattern on the resin insulating layer 32 by depositing the metallic material on a main surface of the resin insulating layer by a method such as a sputtering method, a vapor deposition method, a plating method, or the like, and if required, trimming the material by masking and etching, or the like.

The resin insulating layer 32 functions as a base for forming the thin-film conductor layer 31. Also, the resin insulating layer 32 functions as an insulator for securing electric insulation between thin-film conductor layers 31. The bonding layer 2 (upper surface) is also bonded to the bottom surface of the resin insulating layer 32 as well as the thin-film conductor layer 31. This enhances mechanical connection strength between the ceramic substrate 1 and the thin-film wiring layer 3 through the bonding layer 2.

The resin insulating layer 32 is formed in a layer having, for example, a quadrangular shape such as a rectangular shape, a square shape, or the like, or a circular shape and a thickness of about 25 μm. The resin insulating layer 32 is composed of, for example, a resin material such as an epoxy resin, a polyimide resin, a polyamide-imide resin, a polyether imide resin, a liquid crystal polymer, or the like.

The resin insulating layer 32 is composed of, for example, a resin material such as a polyimide resin, a polyamide-imide resin, a polyether imide resin, a liquid crystal polymer, or the like. The resin insulating layer 32 can be formed by, for example, forming a layer of an uncured product of the resin material and then curing the layer. In forming the layer of the uncured product of the resin material, a resin film or the like of a polyethylene resin or the like may be used as a base for forming. After the resin material is cured, the base is removed to produce the resin insulating layer 32 formed in a layer.

The thin-film conductor layers 31 and the resin insulating layers 32 are alternately laminated to form the thin-film wiring layer 3. The thin-film conductor layers 31 formed on and below the resin insulating layer 32 are electrically connected to each other through a via conductor or the like formed in the resin insulating layer 32. In FIG. 1, the via conductor or the like is schematically shown by a broken line (without reference numeral).

The via conductor of the resin insulating layer 32 is formed, for example, as follows. A through hole (without reference numeral) is formed in a portion of the resin insulating layer 32 to pass through in the thickness direction by perforating by laser processing with $CO_2$ laser, YAG laser, or the like, RIE (active ion etching) or solvent etching, or the like. The through hole is filled with a conductor material used as the via conductor by a method such as a sputtering method, a vapor deposition method, a plating method, a conductor paste filling method, or the like, forming the via conductor in the resin insulating layer 32.

The via conductor of the resin insulating layer 32 is composed of, for example, a metallic material such as copper, silver, palladium, gold, platinum, aluminum, chromium, nickel, cobalt, titanium, tungsten, or the like, or an alloy material of these metallic materials. The via conductor of the resin insulating layer 32 can be formed by, for example, filling the through hole of the resin insulating layer 32 with a metal paste prepared by kneading a powder of the metallic material with an organic solvent and a binder, and then removing the organic component by heating. In this case, a metal film forming technique such as a plating method, a sputtering method, or the like may be combined.

The thin-film conductor layer 31 formed on the uppermost surface of the thin-film wiring layer 3 is electrically connected to, for example, an electrode of a semiconductor element through a probe 4. The thin-film conductor layer 31 formed on the lowermost surface of the thin-film wiring layer 3 is connected directly to an upper end surface of the via conductor 23 of the bonding layer 2.

In the thin-film wiring substrate, the lower end surface of the through conductor 23 of the bonding layer 2 is electrically connected to the wiring conductor 11 of the ceramic substrate 1, and thus the electrode of a semiconductor element electrically connected to the thin-film conductor layer 31 is electrically connected to a connection pad 12 on the lower surface of the ceramic substrate 1. When the connection pad 12 is electrically connected to an electric circuit for testing, the semiconductor element can be electrically tested (whether or not operation, storage, or the like can be normally performed). Examples of the semiconductor element include semiconductor integrated circuit elements such as IC, LSI, and the like, a micro-machine (so-called MEMS element) including a micro-electromechanical system formed on a surface of a semiconductor substrate, and the like.

The bonding layer 2 is described in detail. The bonding layer 2 includes a core layer 21 composed of a thermosetting resin and an adhesive layer 22 laminated on each of the upper and lower surfaces of the core layer 21, the adhesive layer 22 being composed of a thermosetting resin having smaller elastic modulus than the thermosetting resin constituting the core layer 21. As described above, the through conductor 23 is formed in the bonding layer 2 to pass through in the thickness direction, and the wiring conductor 11 of the ceramic substrate 11 is electrically connected to the thin-film wiring layer 3 through the through conductor 23 of the bonding layer 2.

The bonding layer 2 includes the core layer 21 composed of a thermosetting resin having larger elastic modulus than the adhesive layers 22 bonded directly to the ceramic substrate 1 and the thin-film wiring layer 3, and thus deformation of the bonding layer 2 can be effectively suppressed.

That is, for example, even when pressure is applied during bonding of the thin-film wiring layer 3 to the ceramic substrate 1 or testing of a semiconductor element, or the like, the core layer 21 with relatively high elastic modulus is little deformed, and thus deformation of the adhesive layers 22 laminated on the upper and lower surfaces of the core layer 21 is also effectively suppressed. Therefore, the resin material (thermosetting resin material) constituting the bonding layer 2 is effectively suppressed from entering between the upper end surface of the via conductor 23 of the bonding layer 2 and the thin-film wiring layer 3. Therefore, it is possible to provide a thin-film wiring substrate including the bonding layer 2 and the thin-film wiring layer 3 which are laminated in order on the upper surface of the ceramic substrate 1, wherein electric connection between the wiring conductor 11 of the ceramic substrate 1 and the thin-film wiring layer 3 can be satisfactorily secured.

In this case, when the bonding layer 2 is entirely composed of the same thermosetting resin material as that constituting the core layer 21, adhesion of the bonding layer 2 to the ceramic substrate 1 and the thin-film wiring layer 3 may be decreased. In other words, since the adhesive layers 22 are laminated on the upper and lower surfaces of the core layer 21, bondability of the bonding layer 2 to the ceramic substrate 1 and the thin-film wiring layer 3 is satisfactorily secured.

The core layer 21 and the adhesive layers 22 each have a thickness of, for example, about 5 to 30 μm. The adhesive layers 22 on the upper surface and the lower surface of the core layer 21 may have the same thickness or different thicknesses.

Examples of the thermosetting resin material constituting the core layer 21 include a polyimide resin, a polyether imide resin, a polyamide-imide resin, an aramid resin, and the like.

The core layer 21 preferably has as high elastic modulus as possible in order to suppress deformation of the bonding layer 2. However, the core 21 having excessively high elastic modulus possibly causes a phenomenon such as peeling at the bonding interfaces between the core layer 21 and the adhesive layers 22 when warping occurs due to a heat load on the thin-film wiring substrate, pressure during test of a semiconductor element, or the like. Also, productivity and economy may be decreased. Therefore, the elastic modulus of the core layer 21 is preferably 2000 MPa to 10000 MPa.

Examples of the thermosetting resin material constituting the adhesive layers 22 include a polyimide resin, a polyquinoline resin, a polyamide-imide resin, an epoxy resin, a polyphenylene ether resin, a fluorocarbon resin, and the like.

The reason for the relatively high bonding strength of the adhesive layers 22 to the ceramic substrates 1, etc. is that the resin material of the adhesive layers 22 readily enters irregularities of the surface (upper surface) etc. due to the relative low elastic modulus of the adhesive layers 22, and thus an anchor effect is exerted to improve the bonding strength. The elastic modulus of the adhesive layers 22 is preferably about 5 MPa to 1500 MPa.

In addition, when each of the core layer 21 and the adhesive layers 22 has the elastic modulus within the above-described range, the elastic modulus of the core layer 21 may be determined to be 1.3 to 20 times the elastic modulus of the adhesive layers 22. For example, when the elastic modulus of the core layer is 2000 MPa, the elastic modulus of the adhesive layers 22 is determined to be about 100 to 1500 MPa. This ratio of elastic modulus can more securely produce the effect of suppressing deformation of the adhesive layers 22 by the core layer 21 while securing adhesion of the adhesive layers 22 to the ceramic substrate 1 and the thin-film wiring layer 3.

When the adhesive layers 22 are composed of a polyimide resin, a polyamide-imide resin, an epoxy resin, or a polyphenylene ether resin, the adhesive layers 22 having the elastic modulus described above can be more easily formed. Also, the resin material can be easily formed into a film (sheet shape) and is thus suitable as a resin material constituting the adhesive layers 22.

When the core layer 21 is composed of a polyimide resin, the core layer 21 having the elastic modulus described above can be more easily formed. Also, the polyimide resin can be easily formed into a film shape and is thus suitable as a resin material constituting the core layer 21. Also, the polyimide resin has high heat resistance of 200° C. or more. Therefore, for example, when the thin-film wiring substrate is used as a substrate for a probe card, the polyimide resin is suitable as a resin material constituting the core layer 21.

The elastic modulus of each of the core layer 21 and the adhesive layers 22 can be adjusted by, for example, adjusting an amount of a curing agent added to the resin material (polyimide resin or the like) used.

The elastic modulus of the bonding layer 2 as a whole is, for example, 500 MPa to 10000 MPa. The elastic modulus of the bonding layer 2 as a whole within the above-described range is effective in securing both rigidity and adhesion which are suitable for bonding together the ceramic substrate 1 and the thin-film wiring layer 3. Therefore, it is possible to satisfactorily secure reliability, appearance, etc. of the thin-film wiring substrate including the thin-film wiring layer 3 and the ceramic substrate 1 which are bonded to each other through the bonding layer 2.

The elastic modulus of the bonding layer 2 as a whole can be adjusted by adjusting the elastic modulus of each of the core layer 21 and the adhesive layers 22, the thickness ratio between the layers, or the like.

In addition, the elastic modulus of the thermosetting resin constituting each of the core layer 21 and the adhesive layers 22 can be measured by, for example, a nano-indentation method.

The bonding layer 2 including, for example, the core layer 21 and the adhesive layers 22, is bonded to the lower surface of the thin-film wiring layer 3 in advance under a condition where at least the adhesive layers 22 are uncured. The thin-film wiring layer 3 with the bonding layer 2 bonded to the lower surface thereof is set and aligned on the upper surface of the ceramic substrate 1 so that the lower end surface of the through conductor 23 faces the predetermined wiring conductor 11, and then the thin-film wiring layer 3 can be laminated and bonded to the ceramic substrate 1 through the bonding layer 2 by heat-curing each of the thermosetting resin materials of the bonding layer 2. The core layer 21 in the bonding layer 2 previously bonded to the lower surface of the thin-film wiring layer 3 may have already been cured. Also, during bonding, pressure may be applied downward from the upper surface side of the thin-film wiring layer 3 so as to enhance adhesion of the bonding layer 2 to the ceramic substrate 1 and the thin-film wiring layer 3.

The steps for bonding together the ceramic substrate 1 and the thin-film wiring layer 3 through the bonding layer 2 are described in further detail with reference to FIG. 3. Figs. 3A to 3D are sectional views showing principal portions in order of step in examples of the steps for bonding together the ceramic substrate 1 and the thin-film wiring layer 3 through the bonding layer 2. In FIG. 3, the same portion as in FIGS. 1 and 2 is denoted by the same reference numeral.

Figure 3A:
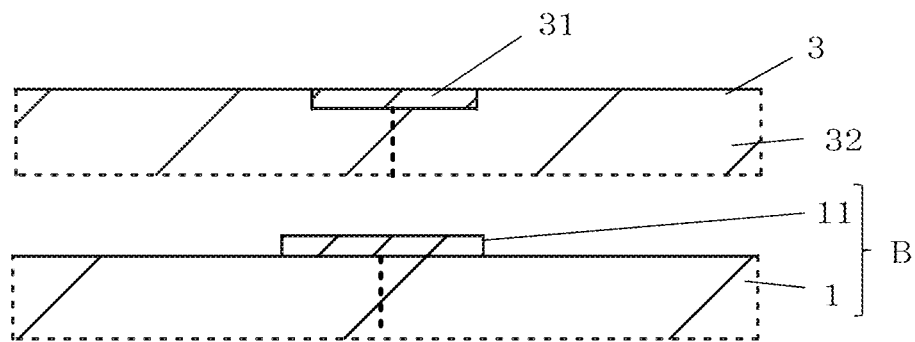
FIG. 3 is a group of drawings for explaining an example of a method for bonding a thin-film wiring layer to a ceramic substrate through a bonding layer.

First, as shown in FIG. 3A, the ceramic substrate 1 and the thin-film wiring layer 3 are formed. The ceramic substrate 1 and the thin-film wiring layer 3 can be formed by, for example, the above-described methods. For convenience of description, the thin-film wiring layer 3 is turned upside down from that shown in FIGS. 1 and 2.

Figure 3B:
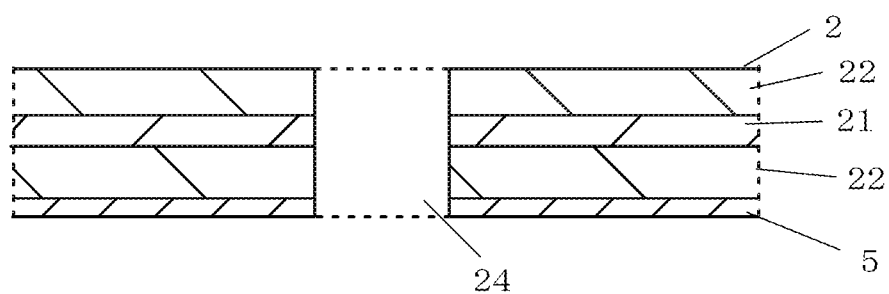
Figure 3C:
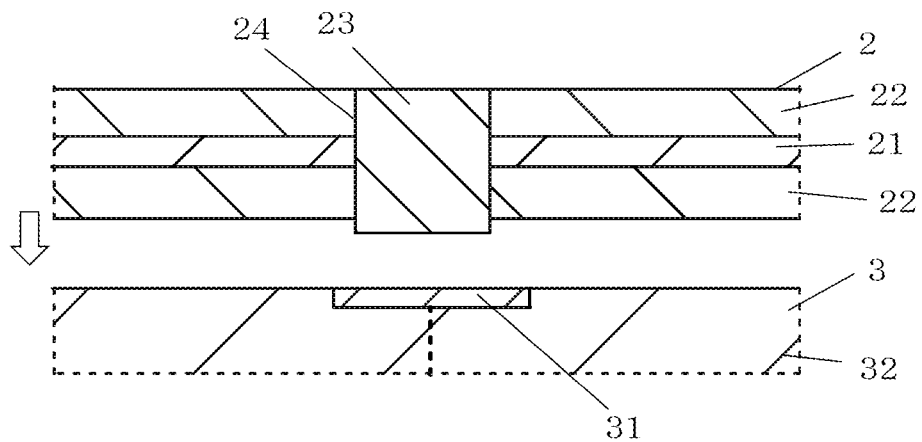

Next, the bonding layer 2 is formed. The bonding layer 2 can be formed, for example, in the order of steps shown in FIG. 3B and Fig. 3C. That is, first as shown in Fig. 3B, the adhesive layer 22, the core layer 21, and the adhesive layer 22 are laminated in order on a resin film 5 such as a polyethylene film or the like, and then a through hole 24 is formed. The through hole 24 also passes through the resin film 5. Next, as shown in Fig. 3C, the through hole 24 is filled with the through conductor 23, and then the resin film 5 is removed to form the bonding layer 2

The through hole 24 passing through the two adhesive layers 22, the core layer 21, and the resin film 5 can be formed by, for example, the same method (laser processing, etching, or the like) as for forming the via conductor in the thin-film wiring layer 3 described above.

Also, the through hole 24 can be filled with the via conductor 23 by the same method using the same material as for the via conductor in the thin-film wiring layer 3 described above. That is, the through hole 24 is filled with a metal paste of copper or the like, which is used for the through conductor 23, and then heated to form the through conductor 23. In an example shown in Fig. 3C, an end of the via conductor 23 slightly projects on the lower surface side of the bonding layer 2 after the resin film 5 is removed.

In this step, the core layer 21 is in a cured state, and the adhesive layers 22 are in a semi-cured state. That is, the core layer 21 in a cured state has large elastic modulus and is little deformed even when pressure is applied in the thickness direction or the like. In addition, the adhesive layers 22 in a semi-cured state have adhesion (so-called tackiness).

The thus-formed bonding layer 2 is aligned and bonded to the thin-film wiring layer 3 so that the end surface of the through conductor 23 faces the thin-film conductor layer 31 of the thin-film wiring layer 3.

Figure 3D:
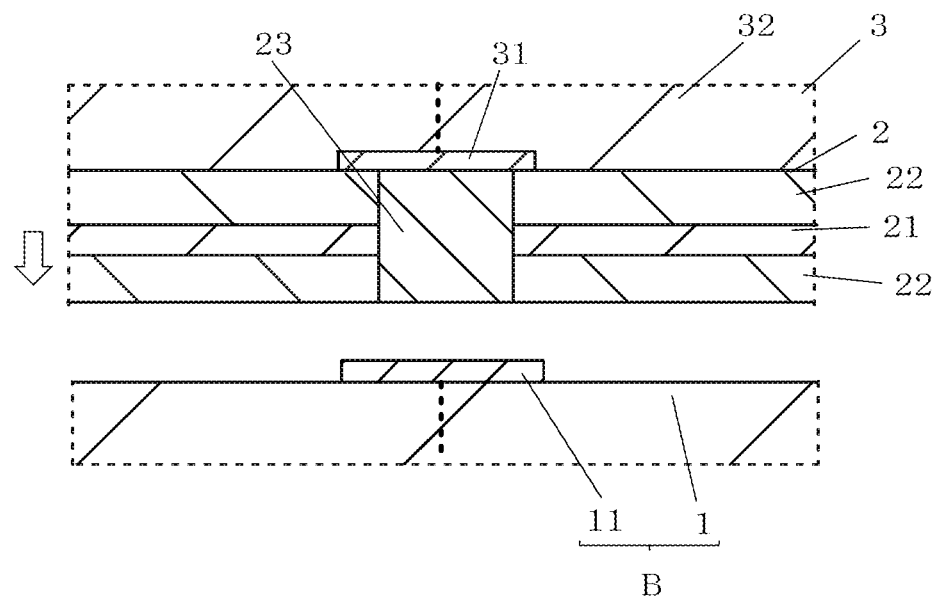

Then, as shown in Fig. 3D, the thin-film wiring layer 3 with the bonding layer 2 bonded thereto is turned upside down, laminated on the upper surface of the ceramic substrate 1, and bonded by curing the adhesive layers 22. In this case, alignment is made so that the end surface of the through conductor 23 faces a predetermined portion of the wiring conductor 11.

As described above, during the bonding, pressure may be applied downward from the upper surface side of the thin-film wiring layer 3 by using a pressing machine or the like. The pressure applied can enhance adhesion of the bonding layer 2 to the ceramic substrate 1 and the thin-film wiring layer 3.

Figure 4:
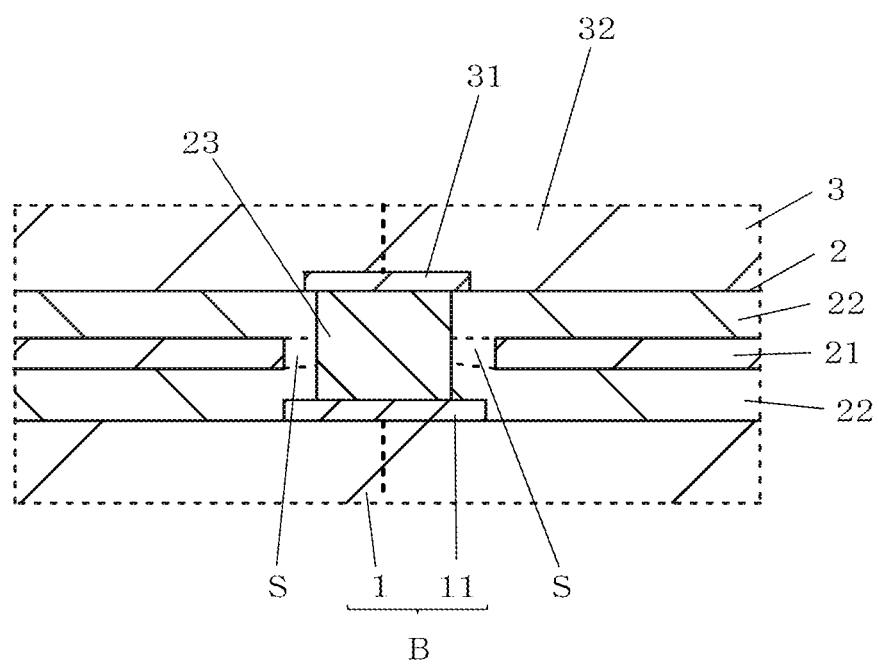
FIG. 4 is a sectional view of a principal portion in an example of steps for bonding a thin-film wiring layer to a ceramic substrate through a bonding layer.

With application of the pressure, the adhesive layers 22 are likely to be more deformed, that is, stretched in the lateral direction, as compared with the core layer 21. In this case, for example, as shown in FIG. 4, the adhesive layers 22 stretched enters a space S produced between the through conductor 23-side end surface of the core layer 21 and the side surface of the through conductor 23. Therefore, entering of a portion of the adhesive layers 22 between the end surface of the through conductor 23 and the thin-film conductor layer 31 is suppressed, thereby enhancing the reliability of electrical connection between the through conductor 23 and the thin-film conductor layer 31. FIG. 4 is a sectional view showing a principal portion in an example of the steps for bonding the thin-film wiring layer 3 to the ceramic substrate 1 through the bonding layer 2. In FIG. 4, the same portion as in FIG. 1 and FIG. 2 is denoted by the same reference numeral.

The adhesive layers 22 may be formed to cover the end surfaces of the core layer 21, for example, as shown in FIG. 2. In other words, the adhesive layers 22 may partially enter a region between the end surface of the core layer 21 and the side surface of the through conductor 23 of the bonding layer 2. Even in this case, the effect of suppressing deformation of the bonding layer 2 by the core layer 21 can be satisfactorily achieved. This possibly results from the fact that for example, when pressure is applied to the bonding layer 2 by the pressure applied during bonding of the thin-film wiring layer 3 to the ceramic substrate 1, the uncured adhesive layers 22 are more deformed than the uncured core layer 21 and flows to the end surface (through conductor 23 side) of the core layer 21.

The thin-film wiring substrate described above is used as a probe card for electrically testing a semiconductor element as described above. The thin-film conductor layer 31 formed on the uppermost surface of the thin-film wiring layer 3 is electrically connected to an electrode of a semiconductor element through the probe 4, and the connection pad 12 formed on the lower surface of the ceramic substrate 1 is electrically connected to an external circuit for electric testing. In order to secure the electric connections, pressure is applied in a direction in which the thin-film wiring substrate is pressed on the semiconductor element. As a result, the semiconductor element is electrically connected to the external circuit through the thin-film wiring substrate, and whether or not the semiconductor element can be normally operated is examined.

In this case, the thin-film conductor layer 31 connected to an electrode of the semiconductor element is formed in a fine pattern with a small adjacent space (so-called pitch) as compared with the connection pad 12 connected to the external circuit. In the thin-film wiring layer 3, the thin-film conductor layer 31 closer to the uppermost layer is formed with a smaller and narrower pitch. Therefore, the electrode of the fine semiconductor element can be easily electrically connected to the larger external circuit with a wider adjacent space than the electrode.

The thermosetting resin which forms the adhesive layer 22 laminated on the upper surface side of the core layer 21 may have higher elastic modulus than that of the adhesive layer 22 laminated on the lower surface side of the core layer 21. Even in this case, the effect of suppressing deformation of the bonding layer 2 by the core layer 21 and the effect of securing bonding strength of the bonding layer to the ceramic substrate 1 etc. by the adhesive layers 22 can be satisfactorily achieved.

In this case, the elastic modulus of the thermosetting resin which forms the adhesive layer 22 laminated on the upper surface side of the core layer 21 may be set to, for example, about 500 to 1500 MPa. Examples of the thermosetting resin having such elastic modulus include a polyimide resin, a polyquinoline resin, a polyamide-imide resin, an epoxy resin, a fluorocarbon resin, and the like.

When the elastic modulus of the thermosetting resin which forms the adhesive layer 22 laminated on the upper surface side of the core layer 21 is about 500 to 1500 MPa, the elastic modulus of the thermosetting resin which forms the adhesive layer 22 laminated on the lower surface side is preferably within a range of about 300 to 700 MPa and a lower value than the adhesive layer 22 laminated on the upper surface side.

More preferably, the elastic modulus of the thermosetting resin which forms the adhesive layer 22 laminated on the upper surface side of the core layer 21 is about 700 to 1000 MPa, and the elastic modulus of the thermosetting resin which forms the adhesive layer 22 laminated on the lower surface side is about 450 to 500.

In this case, deformation of the adhesive layer 22 on the upper surface side of the core layer 21 is more effectively suppressed than on the lower surface side. Therefore, entering of the thermosetting resin material which forms the adhesive layers 22 into the space between the upper end surface of the through conductor 23 of the bonding layer and the thin-film conductor layer 31 of the thin-film wiring layer 3 can be more effectively suppressed. This is more advantageous for enhancing the reliability of electric connection between the thin-film wiring layer 3 and the through conductor 23 finer than the wiring conductor 11 of the ceramic substrate 1.

The coefficient of thermal expansion (coefficient of linear expansion) of each of the core layer 21 and the adhesive layers 22 may be adjusted. For example, the coefficient of thermal expansion of the core layer 21 may be adjusted to be lower than that of the adhesive layers 22. When the coefficient of thermal expansion of the core layer 21 is lower than that of the adhesive layers 22, expansion and contraction of the adhesive layers 22 can be suppressed by the core layer 21 even when heat is applied to the thin-film wiring substrate, for example, used as a substrate for a probe card. Since expansion and contraction of the bonding layer 2, i.e., deformation by heat, is suppressed, deformation, for example, warping of the thin-film wiring substrate or the like, can be suppressed.

When the coefficient of thermal expansion of the core layer 21 is lower than that of the adhesive layers 22, deformation of the bonding layer 2 can be advantageously suppressed. When heat is applied to the bonding layer 2, deformation of the bonding layer 2 can be suppressed by the core layer 22.

The coefficient of thermal expansion of the core layer 21 may be, for example, $30 \times 10^{-6}$/K or less. The coefficient of thermal expansion of the adhesive layers 22 may be, for example, within a range of 30 to $800 \times 10^{-6}$/K. When the coefficient of thermal expansion of the core layer 21 is $30 \times 10^{-6}$/K, the coefficient of thermal expansion of the adhesive layers 22 is more preferably 60 to $800 \times 10^{-6}$/K.

EXAMPLES

Example 1

An effect was confirmed by using a thin-film wiring substrate formed by laminating in order a bonding layer and a thin-film wiring layer on an upper surface of a ceramic substrate composed of an aluminum oxide sintered body.

In addition, a connection pad was formed on the lower surface of the ceramic substrate to be electrically connected to a wiring conductor. The wiring conductor and the connection pad of the ceramic substrate were formed using a tungsten metalized layer.

The bonding layer was formed by laminating a core layer (elastic modulus of about 2000 MPa) composed of a polyimide resin and adhesive layers (elastic modulus of about 1000 MPa) composed of a polyamide-imide resin. Each of the core layer and the adhesive layers had a thickness of about 10 μm.

The thin-film wiring layer was formed by alternately laminating, in three layers, a resin insulating layer having a thickness of about 20 μm and composed of a polyimide resin and a thin-film conductor layer having a thickness of about 10 μm and composed of copper.

The thin-film conductor layer was formed in a daisy-chain shape in the thin-film wiring layer, in which elliptic patterns having a width of about 80 μm and a diameter of about 130 μm were formed and arranged in a matrix of 1000×1000, and upper and lower thin-film layers were joined to each other in a chain-like form through a via conductor composed of copper in the thin-film conductor layer.

A thin-film wiring substrate including a bonding layer which was formed by using only a polyamide-imide resin having an elastic modulus of about 1000 MPa was prepared as a comparative example. The thin-film wiring substrate of the comparative example was formed by the same method as for the thin-film wiring substrate of the example except the resin material constituting the bonding layer.

The thin-film wiring substrates of both the example and the comparative example were formed by a method of bonding the bonding layer to the lower surface of the thin-film wiring layer and then bonding the thin-film wiring layer to the ceramic substrate through the bonding layer. The pressure applied during bonding was 3 MPa.

The multilayer wiring substrates of both the example and the comparative example were measured for a connection resistance value of a daisy chain by using a digital multimeter. A test method included first measuring an initial resistance value and then again measuring a resistance value after the wiring substrate was repeatedly (about five times) heated at about 200° C. on a heat block. Further, a resistance value was measured after 1000 cycles of a temperature cycle test (TCT) under the condition of −55° C. to 125° C. to compare changes of the connection resistance value from the initial resistance value.

In measuring a resistance value, the thin-film wiring substrate was pressed vertically with a pressure of 0.5 MPa as a condition for accelerating deformation of the bonding layer.

As a result, it was confirmed that the thin-film wiring substrate of the example causes no disconnection between the thin-film wiring layer and the wiring conductor and the connection pad of the ceramic substrate and no increase in resistance value, and thus has high reliability of electric connection. On the other hand, in the thin-film wiring substrate of the comparative example, disconnection and large variation in connection resistance value were observed in an initial stage, and also disconnection and significant increase in connection resistance value were observed after heating and after the temperature cycle test.

Therefore, the effect of suppressing deformation of the bonding layer and improving the reliability of electric connection between the thin-film wiring layer and the ceramic substrate could be confirmed in the thin-film wiring substrate of the present invention.

Example 2

The elastic modulus of an adhesive layer was changed to 80, 100, 500, 800, 1200, 1500, and 1700 MPa to prepare thin-film wiring substrates as samples, and changes in connection resistance value were measured by the same method as in Example 1. As a result, it could be confirmed that in any one of the samples, an increase in connection resistance value is not produced, and the reliability of electric connection of the thin-film wiring substrate is secured.

In the sample including the adhesive layer having an elastic modulus of 50 MPa (elastic modulus of a core layer was about 25 times that of the adhesive layer), slight irregularities occurred in a peripheral portion of the bonding layer. In addition, the sample including the adhesive layer having an elastic modulus of 1700 MPa (elastic modulus of a core layer was about 1.2 times that of the adhesive layer) exhibited low adhesion of the adhesive layer to the ceramic substrate and showed the tendency to require much time for bonding.

REFERENCE SIGNS LIST

B . . . base
1 . . . ceramic substrate
11 . . . wiring conductor
12 . . . connection pad
2 . . . bonding layer
21 . . . core layer
22 . . . adhesive layer
23 . . . through conductor
24 . . . through hole
3 . . . thin-film wiring layer
31 . . . thin-film conductor layer
32 . . . resin insulating layer
4 . . . probe
5 . . . resin film

What is claimed is:

1. A thin-film wiring substrate comprising:
a base that includes a ceramic substrate having an upper surface and a wiring conductor provided on the upper surface of the ceramic substrate;
a bonding layer laminated on the upper surface of the ceramic substrate;
a thin-film wiring layer laminated on a top surface of the bonding layer;
and a through conductor that passes through the bonding layer in a thickness direction and electrically connects the wiring conductor to the thin-film wiring layer,
wherein the bonding layer includes a core layer composed of a thermosetting resin, and
adhesive layers comprising a first adhesive layer laminated on an upper surface of the core layer and in contact with the thin-film wiring layer and a second adhesive layer laminated on a lower surface of the core layer and in contact with the upper surface of the ceramic substrate,
the adhesive layers being composed of a thermosetting resin having an elastic modulus range of about 100 MPa to about 1500 MPa and the thermosetting resin constituting the core layer having an elastic modulus range of about 2000 MPa to about 10000 MPa, and
the first adhesive layer laminated on the upper surface of the core layer has an elastic modulus larger than that of the second adhesive layer laminated on the lower surface of the core layer.

2. The thin-film wiring substrate according to claim 1, wherein the adhesive layers are composed of a polyimide resin, a polyamide-imide resin, an epoxy resin, or a polyphenylene ether resin.

3. The thin-film wiring substrate according to claim 2, wherein the core layer is composed of a polyimide resin.

4. A substrate for a probe card comprising:
the thin-film wiring substrate according to claim 1; and
a probe provided on an upper surface of the thin-film wiring layer of the think-film wiring substrate and electrically connected to the wiring conductor.

* * * * *